(12) United States Patent  
Shin et al.

(10) Patent No.: US 8,991,887 B2  
(45) Date of Patent: *Mar. 31, 2015

(54) SUCTION STRUCTURE, ROBOT HAND AND ROBOT

(71) Applicant: Kabushiki Kaisha Yaskawa Denki, Kitakyushu-shi (JP)

(72) Inventors: Daisuke Shin, Fukuoka (JP); Machiko Kamijo, Fukuoka (JP); Ryuji Ando, Fukuoka (JP)

(73) Assignee: Kabushiki Kaisha Yaskawa Denki, Kitakyushu-Shi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/324,081

(22) Filed: Jul. 4, 2014

(65) Prior Publication Data

US 2015/0008689 A1  Jan. 8, 2015

(30) Foreign Application Priority Data

Jul. 8, 2013 (JP) .................................. 2013-142869

(51) Int. Cl.  
*B25J 15/06* (2006.01)

(52) U.S. Cl.  
CPC .......... *B25J 15/0616* (2013.01); *B25J 15/0683* (2013.01); *Y10S 901/40* (2013.01)  
USPC .............................. 294/183; 294/213; 901/40

(58) Field of Classification Search  
USPC ............. 294/183, 213, 189; 901/40; 414/941; 269/21  
See application file for complete search history.

(56) References Cited

U.S. PATENT DOCUMENTS

| | | | | |
|---|---|---|---|---|
| 2,853,333 | A * | 9/1958 | Littell | 294/189 |
| 6,193,291 | B1 * | 2/2001 | Morroney | 294/189 |
| 6,906,790 | B2 * | 6/2005 | Kikuchi et al. | 355/75 |
| 6,942,265 | B1 * | 9/2005 | Boyd et al. | 294/189 |
| 7,044,521 | B2 * | 5/2006 | Tokunaga | 294/183 |
| 7,055,875 | B2 * | 6/2006 | Bonora et al. | 294/188 |
| 2002/0011735 | A1 * | 1/2002 | Nagai et al. | 294/64.1 |
| 2008/0025824 | A1 | 1/2008 | Hashimoto | |
| 2012/0168089 | A1 * | 7/2012 | Schmidt-Lange et al. | 156/538 |
| 2014/0161582 | A1 * | 6/2014 | Maffeis | 414/800 |

FOREIGN PATENT DOCUMENTS

JP 2008-028134 2/2008

* cited by examiner

*Primary Examiner* — Saul Rodriguez  
*Assistant Examiner* — Gabriela Puig  
(74) *Attorney, Agent, or Firm* — Mori & Ward, LLP

(57) ABSTRACT

A suction structure includes a pad and a fixing base. The pad includes a contact portion which makes contact with a target object to be sucked and which has a seal wall, and a major surface portion which is surrounded by the contact portion and which defines an inner space in conjunction with the seal wall as the contact portion makes contact with the target object. The fixing base includes a support portion configured to support the pad at a position offset from the center of the major surface portion of the pad, and a suction hole configured to bring the inner space into communication with a vacuum source.

23 Claims, 12 Drawing Sheets

SUCTION STRUCTURE, ROBOT HAND AND ROBOT

CROSS-REFERENCE TO RELATED APPLICATION

The present disclosure contains subject matter related to that disclosed in Japanese Priority Patent Application No. 2013-142869 filed with the Japan Patent Office on Jul. 8, 2013, the entire contents of which are incorporated herein by reference.

BACKGROUND OF THE INVENTION

1. Field of the Invention

Embodiments disclosed herein relate to a suction structure, a robot hand and a robot.

2. Description of the Related Art

In the related art, there is known a substrate transfer robot that transfers a thin substrate such as a wafer or a glass substrate (see, e.g., Japanese Patent Application Publication No. 2008-28134).

The robot includes, e.g., an arm and a robot hand (hereinafter referred to as a "hand") installed to a distal end portion of the arm. The robot transfers a substrate by operating the arm in a horizontal direction and other directions, while causing the robot hand to hold the substrate.

In the course of transferring the substrate, it is necessary to reliably hold the substrate and to prevent position shift of the substrate. Thus, there is proposed a robot which includes a hand having a suction structure using a vacuum pad or the like and which holds a substrate during the transfer thereof by causing the suction structure to suck the substrate.

If the robot is used in a semiconductor manufacturing process, a substrate undergoes a thermal treatment process such as a film formation process or the like. Therefore, the robot often transfers a substrate heated to a high temperature in the thermal treatment process.

SUMMARY OF THE INVENTION

A suction structure according to one aspect of the present disclosure includes a pad and a fixing base. The pad includes a contact portion which makes contact with a target object to be sucked and a major surface portion surrounded by the contact portion. The contact portion has a seal wall. The major surface portion defines an inner space in conjunction with the seal wall as the contact portion makes contact with the target object. The fixing base includes a support portion which supports the pad at a position offset from the center of the major surface portion of the pad, and a suction hole configured to bring the inner space into communication with a vacuum source.

DESCRIPTION OF THE EMBODIMENTS

Embodiments of a suction structure, a robot hand and a robot will now be described in detail with reference to the accompanying drawings. The present disclosure is not limited to the embodiments.

Hereinafter, description will be made by taking, as an example, a case where the robot is a substrate transfer robot for transferring a wafer as a target object. The wafer is designated by reference symbol "W". In the following description, each of the rigid elements which constitute a mechanical structure and which can make movement relative to each other will be referred to as a "link". The "link" will be often referred to as an "arm".

Description made with reference to FIGS. 1 to 5C is directed to a first embodiment which takes, as an example, a case where a pad is made easily bendable by forming a thin portion in the pad. Description made with reference to FIGS. 6 to 9 is directed to a second embodiment which takes, as an example, a case where a pad is made easily bendable by supporting the pad in an off-centered position.

First Embodiment

Figure 1:
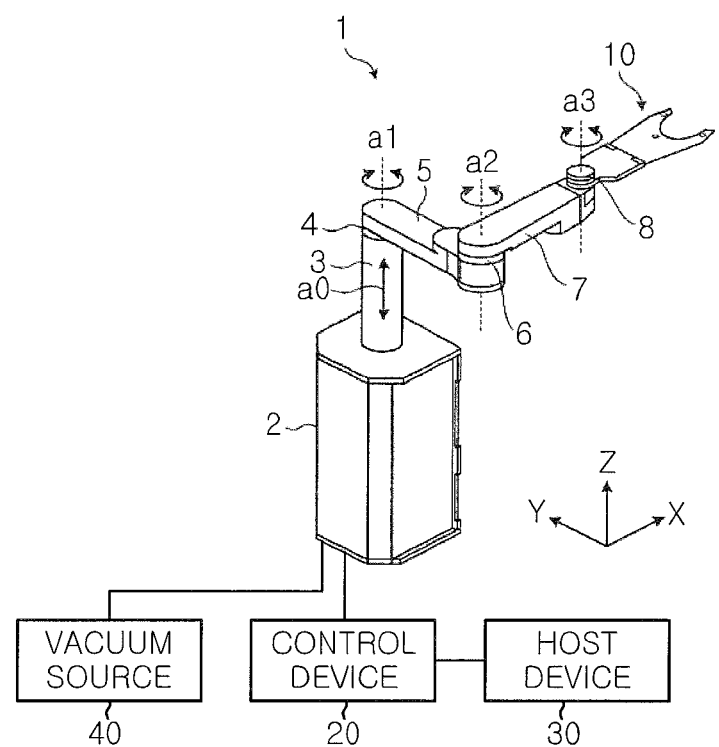
FIG. 1 is a schematic perspective view of a robot according to a first embodiment.

First, the configuration of a robot 1 according to the first embodiment will be described with reference to FIG. 1. FIG. 1 is a schematic perspective view of the robot 1 according to the first embodiment.

For the sake of easy understanding, a three-dimensional rectangular coordinate system including a Z-axis whose positive direction extends vertically upward and whose negative direction extends vertically downward is indicated in FIG. 1. The direction extending along an X-Y plane designates a "horizontal direction". This rectangular coordinate system is sometimes indicated in other drawings used in the following description.

In the following description, for the purpose of convenience in description, the positional relationship between the respective parts of the robot 1 will be described under the assumption that the swing position of the robot 1 and the orientation thereof are in the states shown in FIG. 1.

In the following description, it is sometimes the case that, with respect to a plurality of components, some are designated by reference symbols with the others not given any reference symbol. In this case, it is assumed that some of the components designated by the reference symbols are identical in configuration with the remaining components.

As shown in FIG. 1, the robot 1 includes a base 2, a lifting and lowering unit 3, a first joint unit 4, a first arm 5, a second joint unit 6, a second arm 7, a third joint unit 8 and a hand 10.

The base 2 is a base unit of the robot 1 and is fixed to a floor surface or a wall surface. In some case, the robot 1 is fixed to another device by using the upper surface of the base 2. The lifting and lowering unit 3 is installed so that it can slide in a vertical direction (a Z-axis direction) with respect to the base 2 (see a double-head arrow a0 in FIG. 1). The lifting and lowering unit 3 moves the arm unit of the robot 1 up and down along the vertical direction.

The first joint unit 4 is a rotary joint rotatable about an axis a1. The first arm 5 is rotatably connected to the lifting and lowering unit 3 through the first joint unit 4 (see a double-head arrow around the axis a1 in FIG. 1).

The second joint unit 6 is a rotary joint rotatable about an axis a2. The second arm 7 is rotatably connected to the first arm 5 through the second joint unit 6 (see a double-head arrow around the axis a2 in FIG. 1).

The third joint unit 8 is a rotary joint rotatable about an axis a3. The hand 10 is rotatably connected to the second arm 7 through the third joint unit 8 (see a double-head arrow around the axis a3 in FIG. 1).

The robot 1 is equipped with a drive source (not shown) such as a motor or the like. Each of the first joint unit 4, the second joint unit 6 and the third joint unit 8 is rotated by the operation of the drive source.

The hand 10 is an end effector that vacuum-sucks and holds a wafer W. Details of the configuration of the hand 10 will be described later with reference to FIG. 2 and the following figures. In FIG. 1, there is shown a case where the robot 1 is provided with one hand 10. However, the number of the hand 10 is not limited thereto.

For example, a plurality of hands 10 may be installed in an overlapping relationship to have the axis a3 as an rotation axis so that the hands 10 can independently rotate about the axis a3.

The robot 1 transfers a wafer W with the combination of the up/down operation of the lifting and lowering unit 3 and the rotating operations of the respective arms 5 and 7 and the hand 10. These operations are performed by the instructions from a control device 20 which is connected to the robot 1 through a communication network so that they can make communication with each other.

The control device 20 is a controller that controls the operation of the robot 1. For instance, the control device 20 instructs the operation of the aforementioned drive source. Responsive to the instruction transmitted from the control device 20, the robot 1 rotates the drive source by an arbitrary angle, thereby rotating the arm unit.

This operation control is performed based on teaching data stored in the control device 20 in advance. However, there may be a case where the teaching data are obtained from a host device 30 connected to the control device 20 so that they can make communication with each other.

Figure 2:
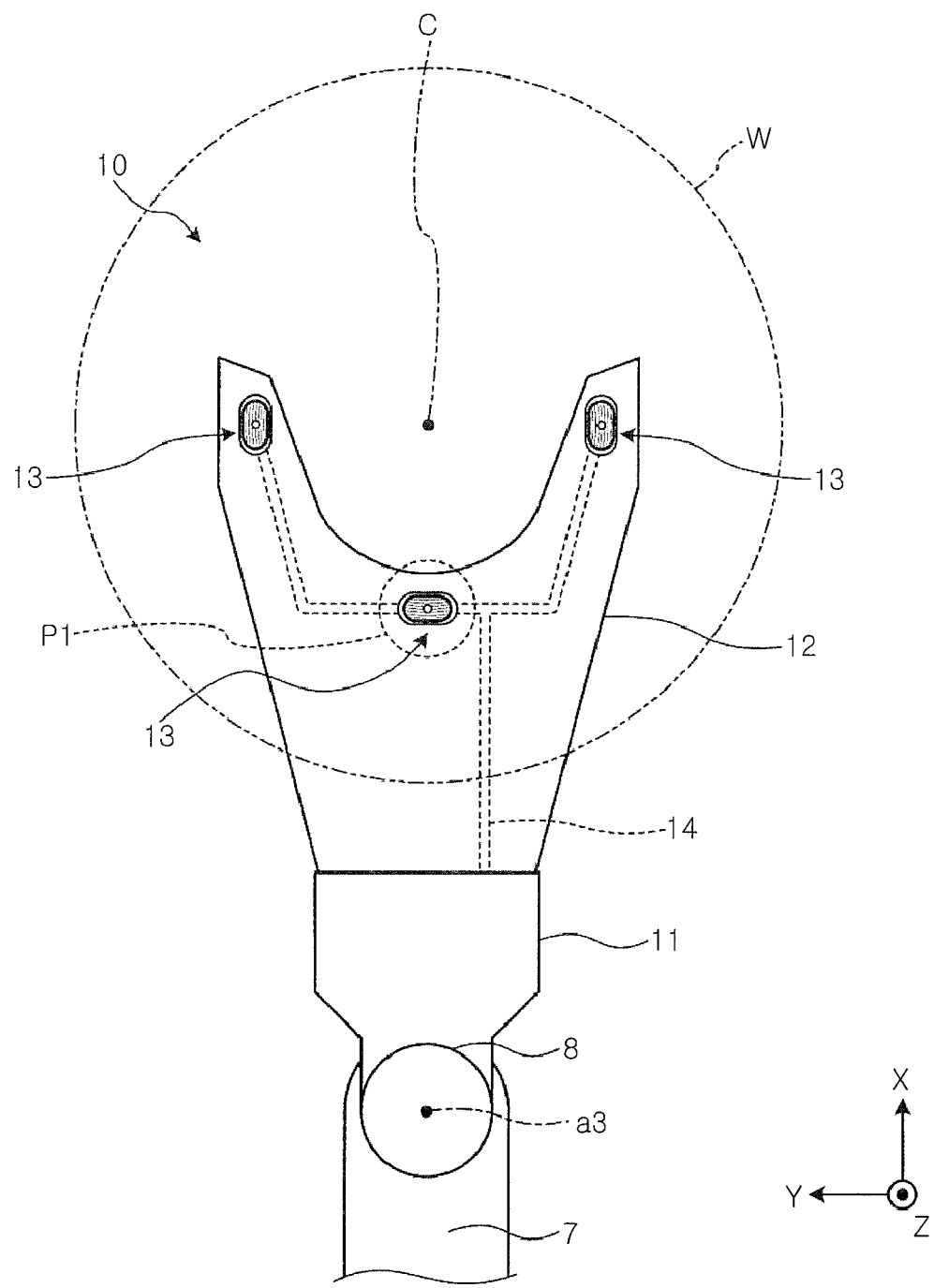
FIG. 2 is a schematic plan view of a hand according to the first embodiment.

Next, the configuration of the hand 10 will be described with reference to FIG. 2. FIG. 2 is a schematic plan view of the hand 10 according to the first embodiment. In FIG. 2, the wafer W in a normal position is indicated by a double-dot chain line. In this regard, the normal position refers to a position where the wafer W is ideally located. In the following description, the center of the wafer W existing in the prescribed position will be designated by reference symbol "C".

As shown in FIG. 2, the hand 10 is installed in the distal end portion of the second arm 7 through the third joint unit 8 so as to rotate about the axis a3. The hand 10 includes a plate holder portion 11, a plate 12, pads 13 and a vacuum path 14.

The plate holder portion 11 is connected to the third joint unit 8 and is configured to hold the plate 12. The plate 12 is a member serving as a base of the hand 10 and is made of ceramic or the like. In FIG. 2, there is illustrated the plate 12 whose distal end portion has a bifurcated shape, but the shape of the plate 12 is not limited thereto.

The pads 13 are members that vacuum-suck the wafer W to hold the wafer W on the hand 10. In the present embodiment, three pads 13 are installed in the positions shown in FIG. 2 and are configured to suck and hold the wafer W at three points. The number of the pads 13 is not limited to three and may be, e.g., more than three. As shown in FIG. 2, each of the pads 13 is formed into, e.g., a substantially oblong shape with round corners or an elliptical shape. Details of the configuration of each of the pads 13 will be described later with reference to FIG. 3A and the ensuing figures.

The vacuum path 14 is a suction route that extends from the respective pads 13 to a vacuum source 40. For example, as shown in FIG. 2, the vacuum path 14 is formed within the plate 12. As the wafer W is placed on the pads 13, the vacuum source 40 performs sucking through the vacuum path 14 and the wafer W is sucked to the pads 13. The vacuum path 14 may be formed in any position insofar as the vacuum path 14 enables the vacuum source to perform sucking.

Examples of the shape of a warped wafer W includes a so-called "dome shape" in which the wafer W is gradually curving upward toward the center C, a so-called "bowl shape" in which the wafer W is gradually curving downward toward the center C, and a random shape in which the wafer W has the dome shape and the bowl shape in combination. However, in reality, it will be sufficient to assume that one of the "dome shape" and the "bowl shape" is generated in the local area of the wafer W on each of the pads 13. For that reason, the behavior of each of the pads 13 will now be described by taking, as an example, a case where the warped wafer W has the "dome shape" or the "bowl shape".

That is to say, it can be said that the wafer W takes a warped shape having a deflection curve extending in a radial direction. In the present embodiment, even if the wafer W is warped, the pads 13 are made to conform to the warped wafer W, thereby reliably vacuum-sucking the wafer W.

Next, the configuration of each of the pads 13 according to the first embodiment will be described in detail. In the following description, among the pads 13 shown in FIG. 2, only the pad 13 surrounded by a closed curve P1 will be taken as a primary example.

Figure 3A:
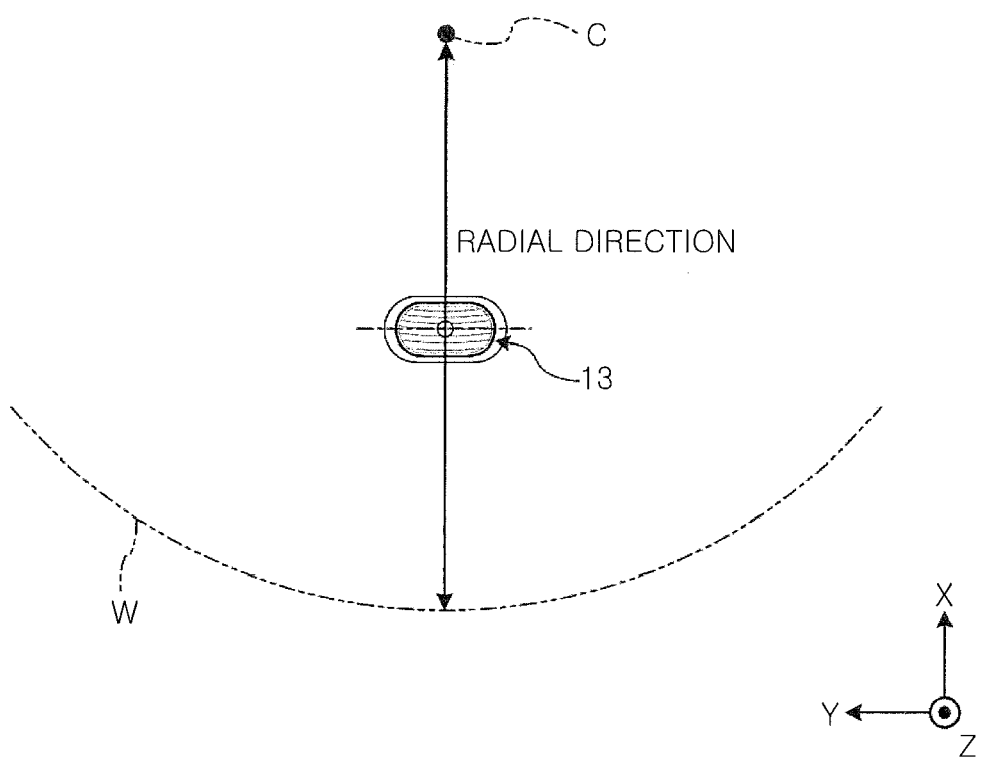
FIG. 3A is a schematic plan view showing an arrangement example of a pad according to the first embodiment.

FIG. 3A is a schematic plan view showing an arrangement example of the pad 13 according to the first embodiment. As shown in FIG. 3A, for instance, the pad 13 is arranged such that the major axis of the pad 13 is substantially orthogonal to a radial direction of the wafer W in the normal position. In other words, the pad 13 is arranged such that the major axis of the pad 13 is tangential to an imaginary circle drawn about the center C of the wafer W in the normal position.

This enables the pad 13 to conform, in the minor axis direction thereof, to the wafer W having a warped shape such as a dome shape or a bowl shape, in which the warp direction of the wafer W extends in the radial direction thereof. More specifically, the warp amount of the wafer W is small in the direction substantially orthogonal to the radial direction of the wafer W but is large in the radial direction of the wafer W. Since the minor axis direction of the pad 13 extends along the radial direction of the wafer W, the warp amount of the wafer W on the pad 13 becomes small. That is to say, the pad 13 can be made to conform to the wafer W without having to largely deform the pad 13. Accordingly, a leak is hard to occur in a vacuum suction process.

Figure 3B:
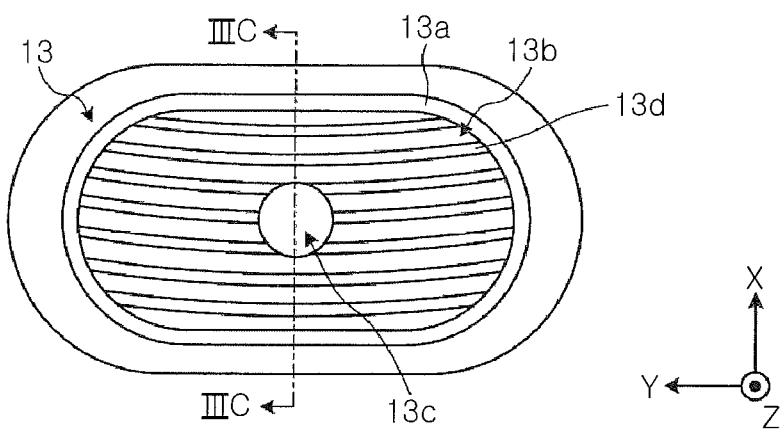
FIG. 3B is a schematic plan view of the pad according to the first embodiment.
Figure 3C:
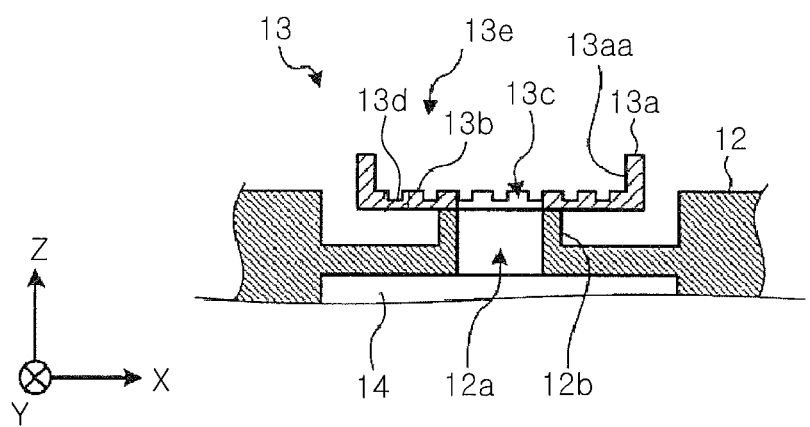
FIG. 3C is a schematic sectional view taken along the line IIIC-IIIC in FIG. 3B.

FIG. 3B is a schematic plan view of the pad 13 according to the first embodiment. FIG. 3C is a schematic sectional view taken along the line IIIC-IIIC in FIG. 3B. As shown in FIG. 3B, the pad 13 includes a contact portion 13a, a major surface portion 13b, a suction hole 13c and grooves 13d.

The pad 13 may be made of various kinds of materials such as a resin and the like. For example, it is preferred that the material of the pad 13 has flexibility in order for the pad 13 to conform to the deformation of the wafer W.

Since the pad 13 makes contact with a wafer W heated to a high temperature, it is preferred that the material of the pad 13 is superior in heat resistance. As one example, a polyimide resin or the like can be suitably used as the material of the pad 13. In the present embodiment, it is assumed that the pad 13 is one-piece molded using a polyimide resin.

The contact portion 13a is a portion that makes contact with the wafer W as the target object to be sucked. The major surface portion 13b is a portion serving as a so-called base plate of the pad 13. The outer periphery of the major surface portion 13b is surrounded by the contact portion 13a. In FIG. 3A, there is illustrated the major surface portion 13b having an oblong shape with round corners, but the shape of the major surface portion 13b is not limited thereto.

The suction hole 13c is formed in the central region of the major surface portion 13b. An inner space K (see FIG. 4B or 4C), which is surrounded by the contact portion 13a and which becomes a vacuum chamber when the contact portion 13a makes contact with the wafer W, is brought into communication with the vacuum source 40 through the suction hole 13c and a below-mentioned suction hole 12a (see FIG. 3C). One or more grooves 13d are formed on the major surface portion 13b to extend along a specified direction. Here, the inner space K becomes the vacuum chamber by the operation of the vacuum source 40 in a state where the contact portion 13a makes contact with the wafer W.

As shown in FIG. 3C, the major surface portion 13b includes a thin portion 13e obtained by forming the grooves 13d. The contact portion 13a includes a seal wall 13aa that defines the inner space K in cooperation with the major surface portion 13b when the contact portion 13a makes contact with the wafer W.

As shown in FIG. 3C, a support portion 12b for supporting the pad 13 with respect to the plate 12 and the suction hole 12a provided to bring the inner space K in to communication with the vacuum source 40 through the vacuum path 14 are formed in the plate 12 in advance. That is to say, the plate 12 is a fixing base of the suction structure according to the present embodiment.

The pad 13 is fixed to the support portion 12b by an adhesive agent or the like while connecting the suction hole 13c and the suction hole 12a to each other.

Figure 3D:
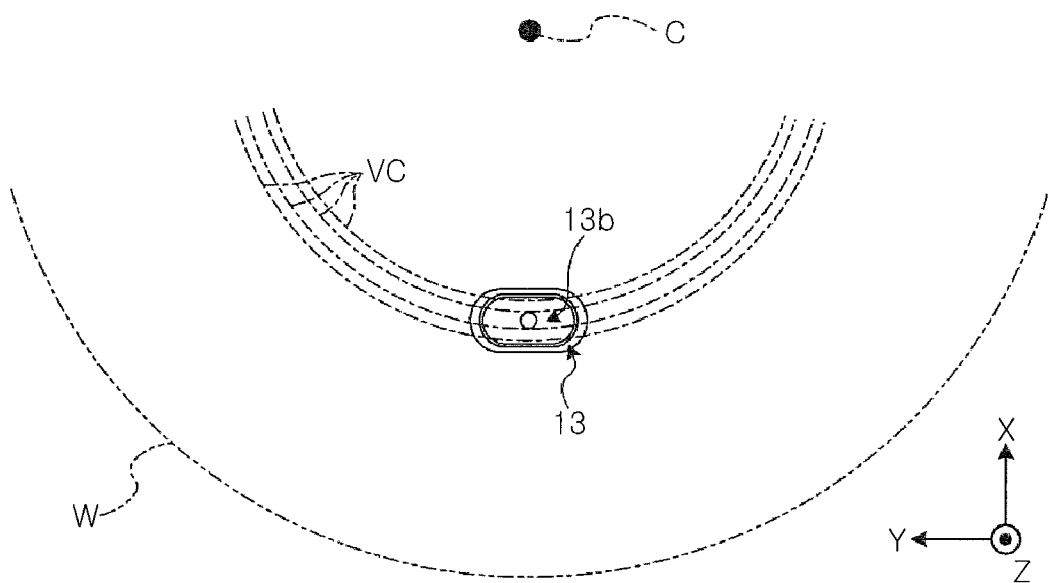
FIG. 3D is a schematic plan view showing one example of an extending direction of grooves.

FIG. 3D is a schematic plan view showing one example of the extending direction of the grooves 13d. As shown in FIG. 3D, each of the grooves 13d are formed on the major surface portion 13b so as to extend substantially along, e.g., a circumferential direction of a imaginary circle VC drawn about the center C of the wafer W in the normal position.

Thus, the pad 13 can be easily bent in the radial direction of the wafer W and can easily conform to the wafer W warped in the radial direction.

Figure 3E:
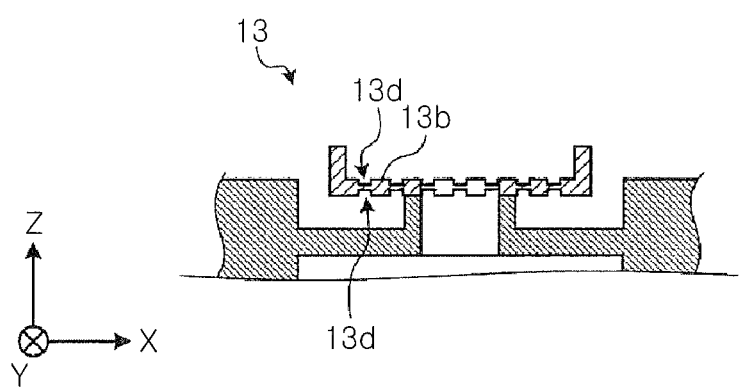
FIG. 3E is a schematic sectional view of a modified example of the pad shown in FIG. 3C.

FIG. 3E is a schematic sectional view of a modified example of the pad 13 shown in n FIG. 3C. In FIG. 3C, there is illustrated a case where the grooves 13d are formed only on the front surface of the major surface portion 13b (on the surface facing the wafer W). Alternatively, as shown in FIG. 3E, grooves may be additionally formed on the rear surface of the major surface portion 13b to extend in the same direction as the grooves 13d, or the grooves may be formed only on the rear surface of the major surface portion 13b.

Figure 4A:
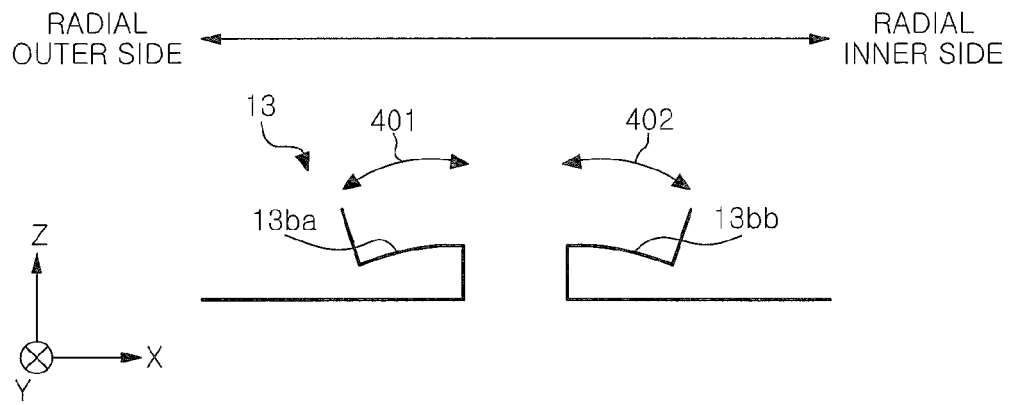
FIGS. 4A to 4C are schematic views for explaining the bending action of the pad according to the first embodiment.
Figure 4B:
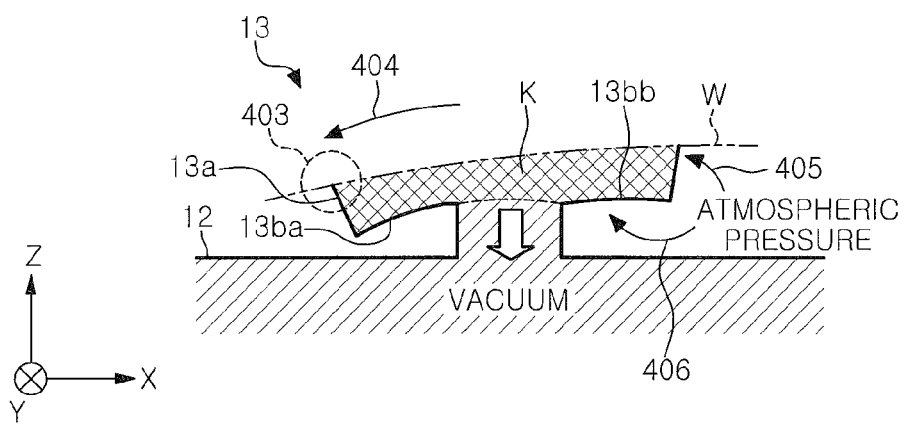
Figure 4C:
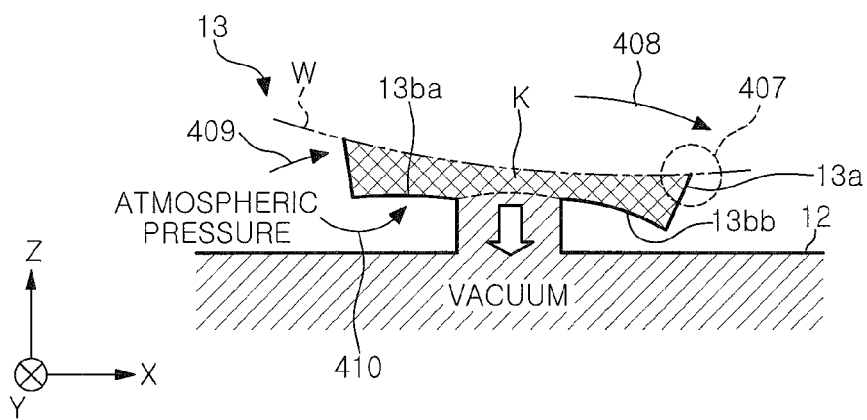

Next, the bending action of the pad 13 according to the present embodiment will be described with reference to FIGS. 4A to 4C. FIGS. 4A to 4C are schematic views for explaining the bending action of the pad 13 according to the first embodiment.

In FIGS. 4A to 4C, for the sake of easy understanding, the pad 13 and its vicinities are shown in a simplified shape. The bending of the pad 13 is expressed in a more exaggerated pattern than the actual bending. This holds true in FIGS. 8A to 8C used in the description of the second embodiment.

As described above, the major surface portion 13b includes the thin portion 13e obtained by forming the grooves 13d. Furthermore, the grooves 13d are formed on the major surface portion 13b so as to extend substantially along, e.g., the circumferential directions of the imaginary circles VC drawn about the center C of the wafer W in the normal position.

Thus, as shown in FIG. 4A, the major surface portion 13b of the pad 13 can be easily bent in the radial direction of the wafer W (see arrows 401 and 402 in FIG. 4A). In the description made with reference to FIGS. 4A to 4C, the section of the major surface portion 13b at the outer side in the radial direction of the wafer W will be referred to as an "outer section 13ba". Similarly, the section of the major surface portion 13b at the inner side in the radial direction of the wafer W will be referred to as an "inner section 13bb".

It is assumed that the wafer W warped in a dome shape as shown in FIG. 4B is sucked by the pad 13. In this case, the wafer W initially makes contact with the contact portion 13a at the side of the outer section 13ba (see a closed curve 403 in FIG. 4B), whereby the outer section 13ba is bent toward the plate 12 by the weight of the wafer W (see an arrow 404 in FIG. 4B).

Since the major surface portion 13b is one-piece formed, the inner section 13bb is lifted up toward the wafer W (see an arrow 405 in FIG. 4B) by the bending of the outer section 13ba. The contact portion 13a at the side of the inner section 13bb makes contact with the wafer W to form the inner space K (see the double hatched region in FIG. 4B).

If sucking is performed by the vacuum source 40 such that the inner space K has a negative pressure, the pad 13 is strongly pressed against the wafer W from below due to the difference between the atmospheric pressure and the pressure of the inner space K (see an arrow 406 in FIG. 4B). Thus, even if the wafer W is warped in a dome shape, the pad 13 can conform to the warped wafer W and it is possible to reliably suck the wafer W.

It is assumed that the wafer W warped in a bowl shape as shown in FIG. 4C is sucked by the pad 13. In this case, the wafer W initially makes contact with the contact portion 13a at the side of the inner section 13bb (see a closed curve 407 in FIG. 4C), whereby the inner section 13bb is bent toward the plate 12 by the weight of the wafer W (see an arrow 408 in FIG. 4C).

Since the major surface portion 13b is one-piece formed, the outer section 13ba is lifted up toward the wafer W (see an arrow 409 in FIG. 4C) by the bending of the inner section 13bb. As the contact portion 13a at the side of the outer section 13*ba* makes contact with the wafer W, there is formed the inner space K (see the double hatched region in FIG. 4C).

If sucking is performed by the vacuum source 40 such that the inner space K has a negative pressure, just like the case where the wafer W is warped in a dome shape, the pad 13 is strongly pressed against the wafer W from below due to the difference between the atmospheric pressure and the pressure of the inner space K (see an arrow 410 in FIG. 4C). Thus, even if the wafer W is warped in a bowl shape, the pad 13 can conform to the warped wafer W and it is possible to reliably suck the wafer W.

Figure 5A:
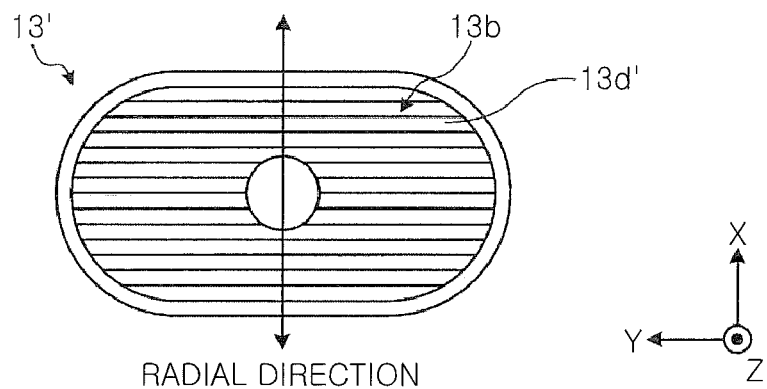
FIG. 5A is a schematic plan view of a grooved pad according to a first modified example.

The formation direction of the grooves 13*d* is not limited to the example described above. Next, certain modified examples of the grooves 13*d* will be described with reference to FIGS. 5A to 5C. The modified example shown in FIG. 5A is a first modified example. The modified example shown in FIG. 5C is a second modified example.

FIG. 5A is a schematic plan view of a pad 13' provided with grooves 13*d*' according to the first modified example.

As shown in FIG. 5A, each of the grooves 13*d*' according to the first modified example is formed to extend along a straight line which is substantially orthogonal to a radial line passing through the center of a imaginary circle drawn about the center of the wafer W in the normal position and the center of the major surface portion 13*b*.

Thus, each of the grooves 13*d*' serves as a flexion line so that the pad 13' can be bent along the radial direction of the wafer W with respect to the wafer W warped in the radial direction. Therefore, even if the wafer W is warped, the pad 13' can easily conform to the warped wafer W. That is to say, it is possible to reliably suck the wafer W.

Figure 5B:
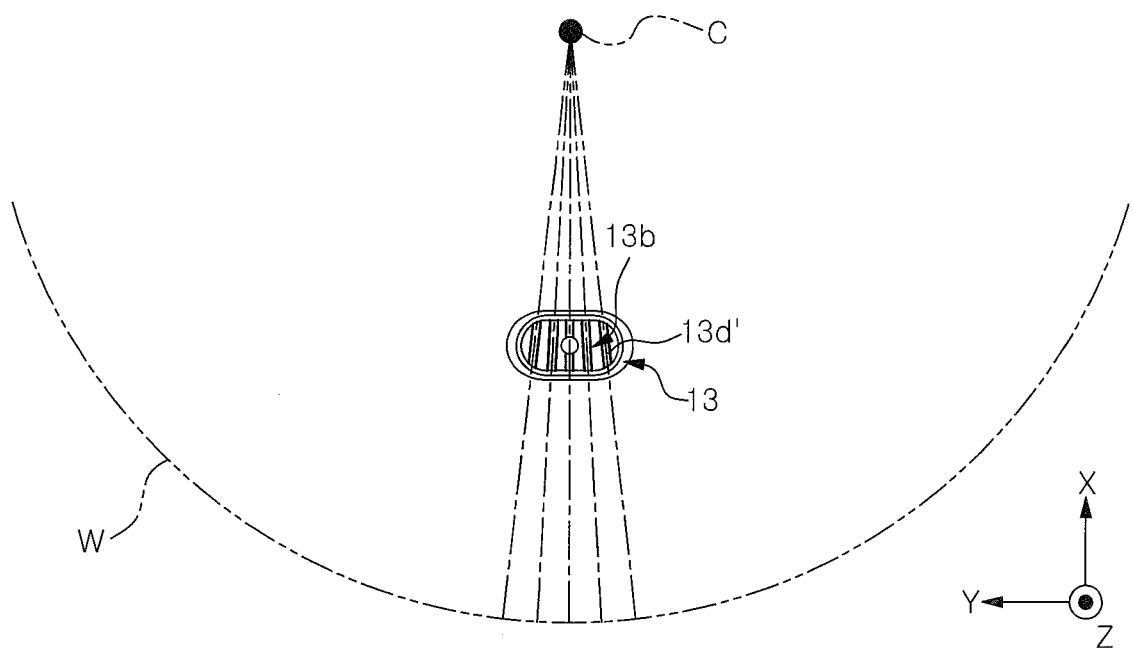
FIG. 5B is a schematic plan view showing another example of an extending direction of grooves.
Figure 5C:
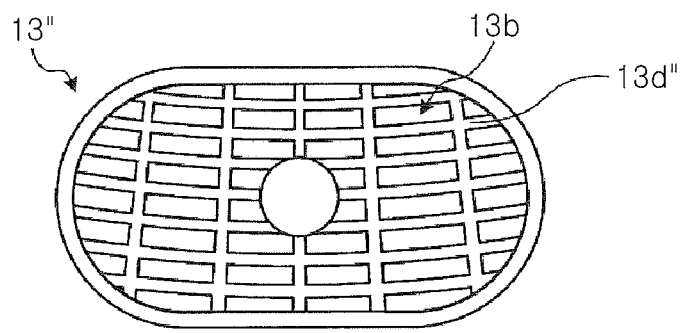
FIG. 5C is a schematic plan view of a grooved pad according to a second modified example.

FIG. 5B is a schematic plan view showing another example of the extending direction of the grooves. As shown in FIG. 5B, for example, grooves may be formed on the major surface portion 13*b* so as to extend along the radial direction of the wafer W in the normal position. FIG. 5C is a schematic plan view of a pad 13" provided with grooves 13*d*" according to the second modified example.

The grooves 13*d* or the grooves 13*d*' described above may be combined with the grooves shown in FIG. 5B.

FIG. 5C shows one example of such a case. That is to say, as shown in FIG. 5C, the grooves 13*d*" according to the second modified embodiment are formed into a lattice shape by the combination of the aforementioned grooves 13*d* (see FIG. 3B) and the grooves shown in FIG. 5B.

Thus, each of the grooves 13*d*" serves as a flexion line so that the pad 13" can be bent along the radial direction of the wafer W with respect to the wafer W warped in the radial direction. Moreover, the grooves 13*d*" divide the major surface portion 13*b*, which makes the pad 13" easily bendable.

That is to say, even if the wafer W is warped, the pad 13" can easily conform to the warped wafer W and it is possible to reliably suck the wafer W.

As described above, the suction structure according to the first embodiment includes the fixing base (plate), the pad, the seal wall, the suction hole and the thin portion. The pad is provided with the contact portion that makes contact with the target object to be sucked and is supported with respect to the fixing base.

The seal wall forms a part of the contact portion and forms an inner space in conjunction with the major surface portion of the pad as the contact portion makes contact with the target object. The suction hole brings the inner space into communication with the vacuum source. The thin portion is formed in the major surface portion of the pad surrounded by the seal wall.

Therefore, according to the suction structure of the first embodiment, it is possible to reliably suck a warped wafer.

The foregoing description has been made by taking, as an example, a case where the pad is made easily bendable by forming the thin portion in the pad. Alternatively, the pad may be made easily bendable by supporting the pad in an off-centered position, or may be made easily bendable by combining the formation of the thin portion in the pad and the support of the pad in the off-centered position. Next, the second embodiment in which a pad is supported in an off-centered position will be described with reference to FIG. 6 and the following figures.

Second Embodiment

Figure 6:
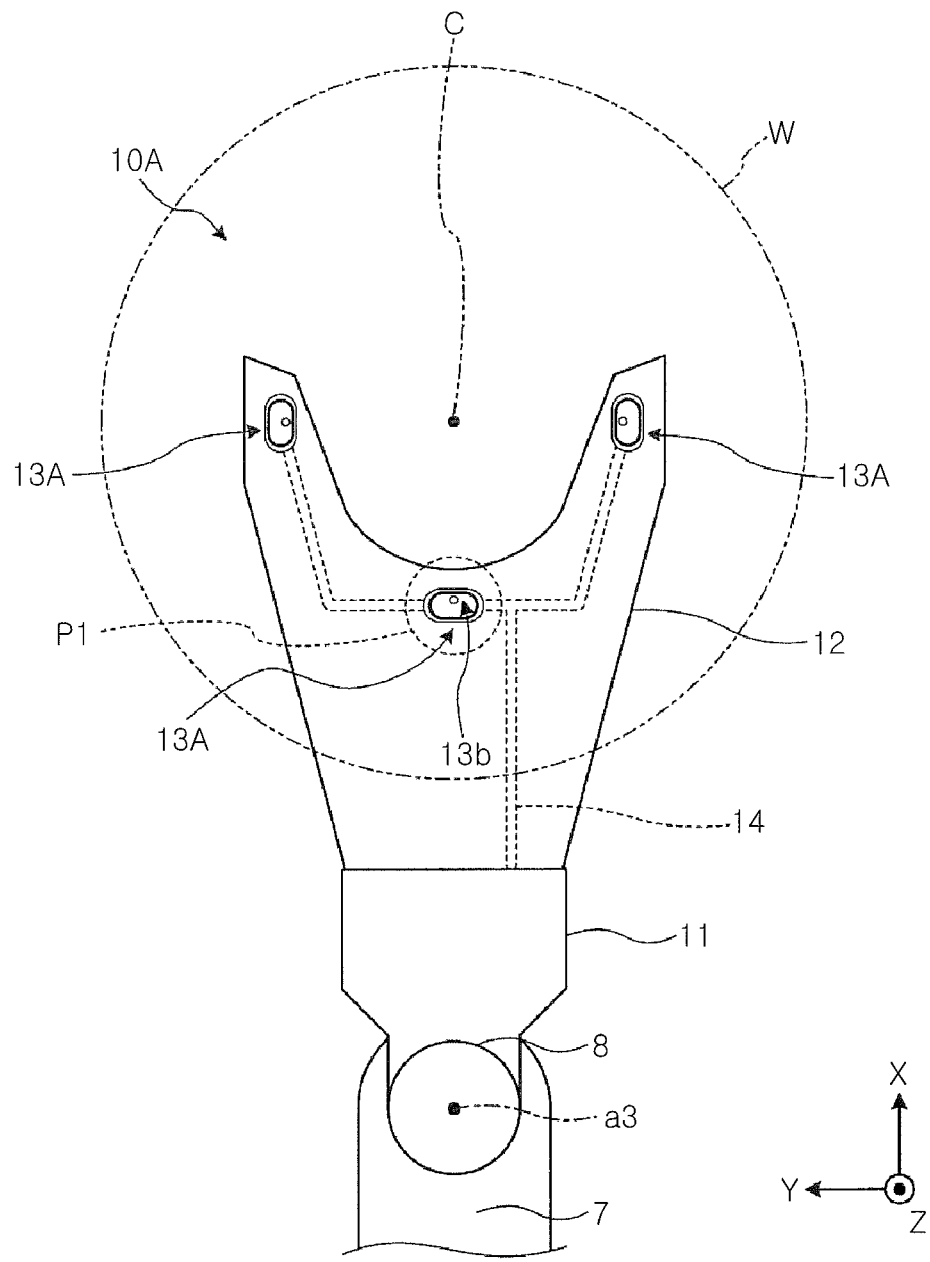
FIG. 6 is a schematic plan view of a hand according to a second embodiment.

FIG. 6 is a schematic plan view of a hand 10A according to the second embodiment. In the second embodiment, description will be primarily made on the components different from those of the first embodiment.

As shown in FIG. 6, the hand 10A includes pads 13A supported in the positions offset from the center of the major surface portion 13*b*.

Next, description will be made on the configuration of the pads 13A. In the following description, among the pads 13A shown in FIG. 6, the pad 13A surrounded by a closed curve P1 will be taken as a major example.

Figure 7A:
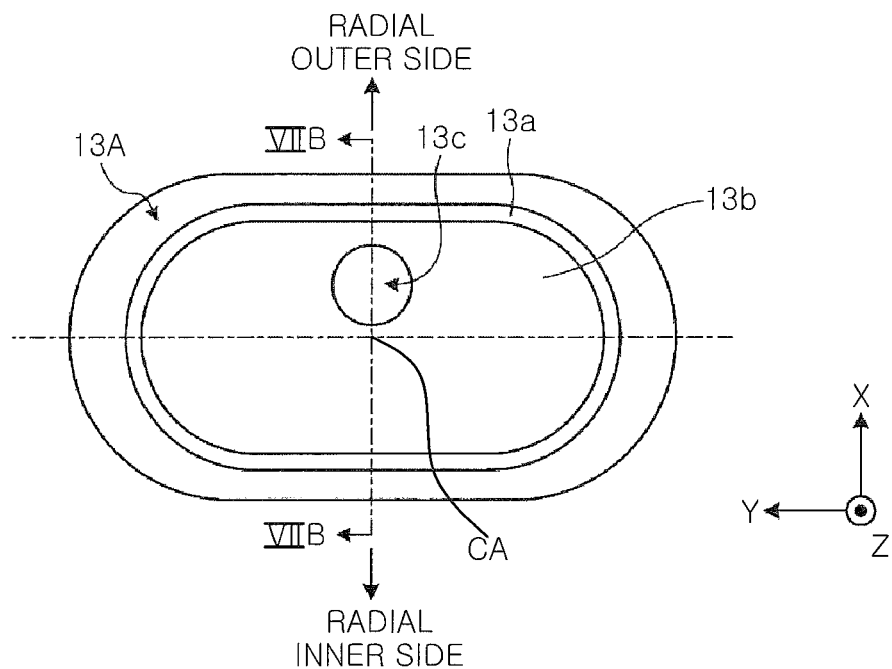
FIG. 7A is a schematic plan view of a pad according to the second embodiment.
Figure 7B:
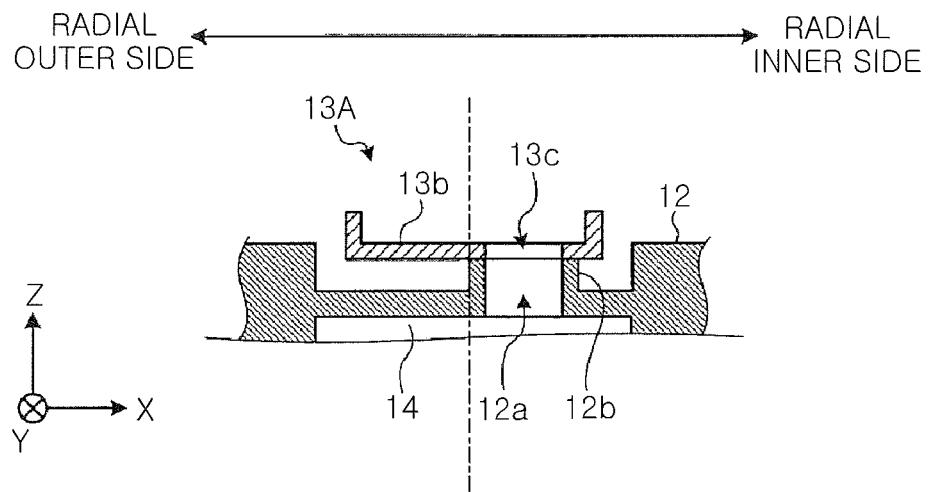
FIG. 7B is a schematic sectional view taken along the line VIIB-VIIB shown in FIG. 7A.

FIG. 7A is a schematic plan view of the pad 13A according to the second embodiment. FIG. 7B is a schematic sectional view taken along the line VIIB-VIIB shown in FIG. 7A. As shown in FIG. 7A, for example, the pad 13A includes a suction hole 13*c* offset radially inward from the center CA of the major surface portion 13*b*.

As shown in FIG. 7B, the plate 12 includes a support portion 12*b* and a suction hole 12*a* arranged to the suction hole 13*c* of the pad 13A, and the suction hole 12*a* brings an inner space into communication with the vacuum source 40 through the vacuum path 14.

Thus, the support portion 12*b* supports the pad 13A at a position offset inward from the center of the major surface portion 13*b* in the radial direction of an imaginary circle drawn about the center of the wafer W in the normal position.

Figure 8A:
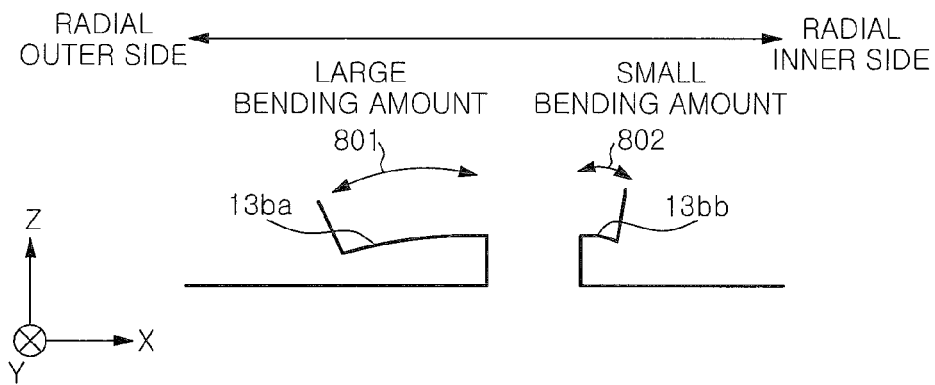
FIGS. 8A to 8C are schematic views for explaining the bending action of the pad according to the second embodiment.
Figure 8B:
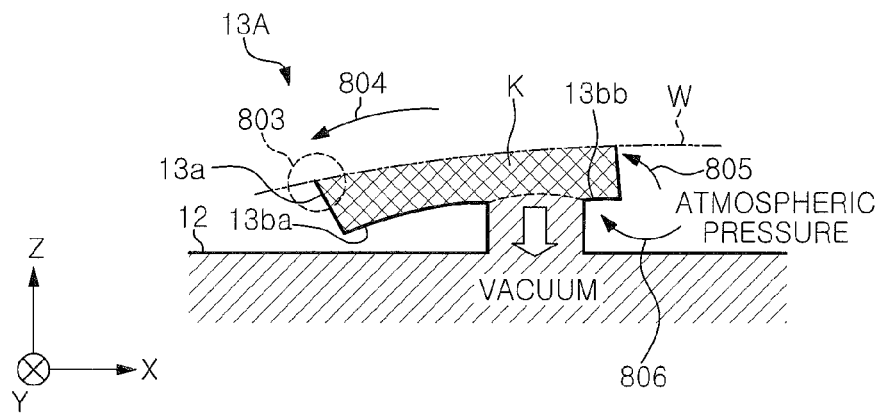
Figure 8C:
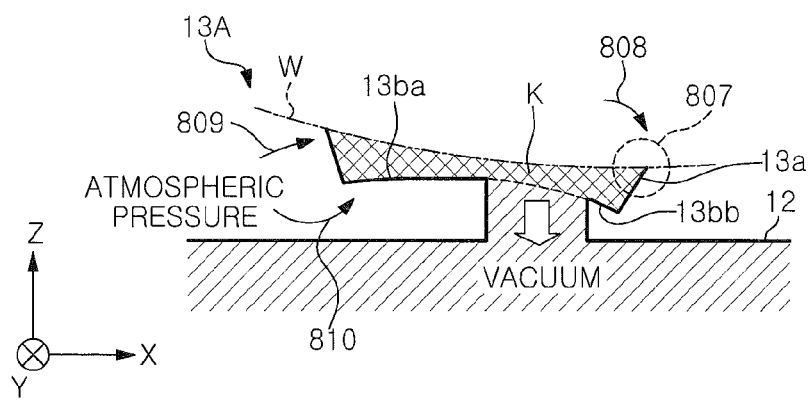

Next, the bending action of the pad 13A according to the present embodiment will be described with reference to FIGS. 8A to 8C. FIGS. 8A to 8C are schematic views showing the bending action of the pad 13A according to the second embodiment.

As described above, the pad 13A is supported by the support portion 12*b* at the position closer to the center of the wafer W than the center of the major surface portion 13*b*. Therefore, as shown in FIG. 8A, the bending amount of the outer section 13*ba* in the radial direction becomes larger than the bending amount of the inner section 13*bb* (see arrows 801 and 802 in FIG. 8A).

Description will be made in more detail. For example, the radial length of the outer section 13*ba* (which is equal to the radial length of the inner section 13*bb*) in case where the center of the major surface portion 13*b* is supported by the support portion 12*b*, is assumed to be 1 L. Furthermore, the bending amount of the outer section 13*ba* in this case is assumed to be δ1.

On the other hand, the radial length of the outer section 13*ba* (which is larger than the radial length of the inner section 13*bb*) in case where the major surface portion 13*b* is supported by the support portion 12*b* in the position offset radially inward from the center of the major surface portion 13b as shown in FIG. 8A, is assumed to be 1.5 L. Furthermore, the bending amount of the outer section 13ba in this case is assumed to be δ2.

If this is applied to a so-called cantilever formula "$\delta = PL^2/2EI$" (where P is the stress, E is the Young's modulus and I is the sectional secondary moment (the inertial moment)) in the structural calculation, δ2 becomes equal to 2.25δ1. That is to say, the bending amount δ is proportional to the square of the length (distance) from the support portion 12b. Therefore, if the length of the outer section 13ba is larger than the length of the inner section 13bb, the bending amount of the outer section 13ba in the radial direction becomes larger than the bending amount of the inner section 13bb.

In case of sucking the wafer W warped in a dome shape as shown in FIG. 8B, the wafer W initially makes contact with the contact portion 13a at the side of the outer section 13ba (see a closed curve 803 in FIG. 8B). The outer section 13ba is largely bent toward the plate 12 by the weight of the wafer W (see an arrow 804 in FIG. 8B).

Since the major surface portion 13b is one-piece formed, the inner section 13bb is lifted up toward the wafer W (see an arrow 805 in FIG. 8B) by the large bending of the outer section 13ba. As the contact portion 13a at the side of the inner section 13bb makes contact with the wafer W, an inner space K is formed (see the double hatched region in FIG. 8B).

If sucking is performed by the vacuum source 40 such that the inner space K has a negative pressure, the pad 13A is strongly pressed against the wafer W from below due to the difference between the atmospheric pressure and the pressure of the inner space K (see an arrow 806 in FIG. 8B). Since the bending amount of the outer section 13ba is large, the pad 13A is strongly pressed and can be made to reliably conform to the wafer W. That is to say, even if the wafer W is warped in a dome shape, it is possible to reliably suck the wafer W.

In case of sucking the wafer W warped in a bowl shape as shown in FIG. 8C, the wafer W initially makes contact with the contact portion 13a at the side of the inner section 13bb (see a closed curve 807 in FIG. 8C). The inner section 13bb is bent toward the plate 12 by the weight of the wafer W (see an arrow 808 in FIG. 8C).

Since the major surface portion 13b is one-piece formed, the outer section 13ba is lifted up toward the wafer W (see an arrow 809 in FIG. 8C) by the bending of the inner section 13bb. In this case, the bending amount of the outer section 13ba is large. Thus, the outer section 13ba is largely lifted up, thereby enabling the contact portion 13a to easily make contact with the wafer W.

If the inner space K is formed by the contact portion 13a at the side of the outer section 13ba making contact with the wafer W (see the double hatched region in FIG. 8C), sucking is performed by the vacuum source 40 such that the inner space K has a negative pressure.

The pad 13A is strongly pressed against the wafer W from below due to the difference between the atmospheric pressure and the pressure of the inner space K (see an arrow 810 in FIG. 8C). Since the bending amount of the outer section 13ba is large, the pad 13A is strongly pressed and can be made to reliably conform to the wafer W. That is to say, even if the wafer W is warped in a bowl shape, it is possible to reliably suck the wafer W.

Figure 9:
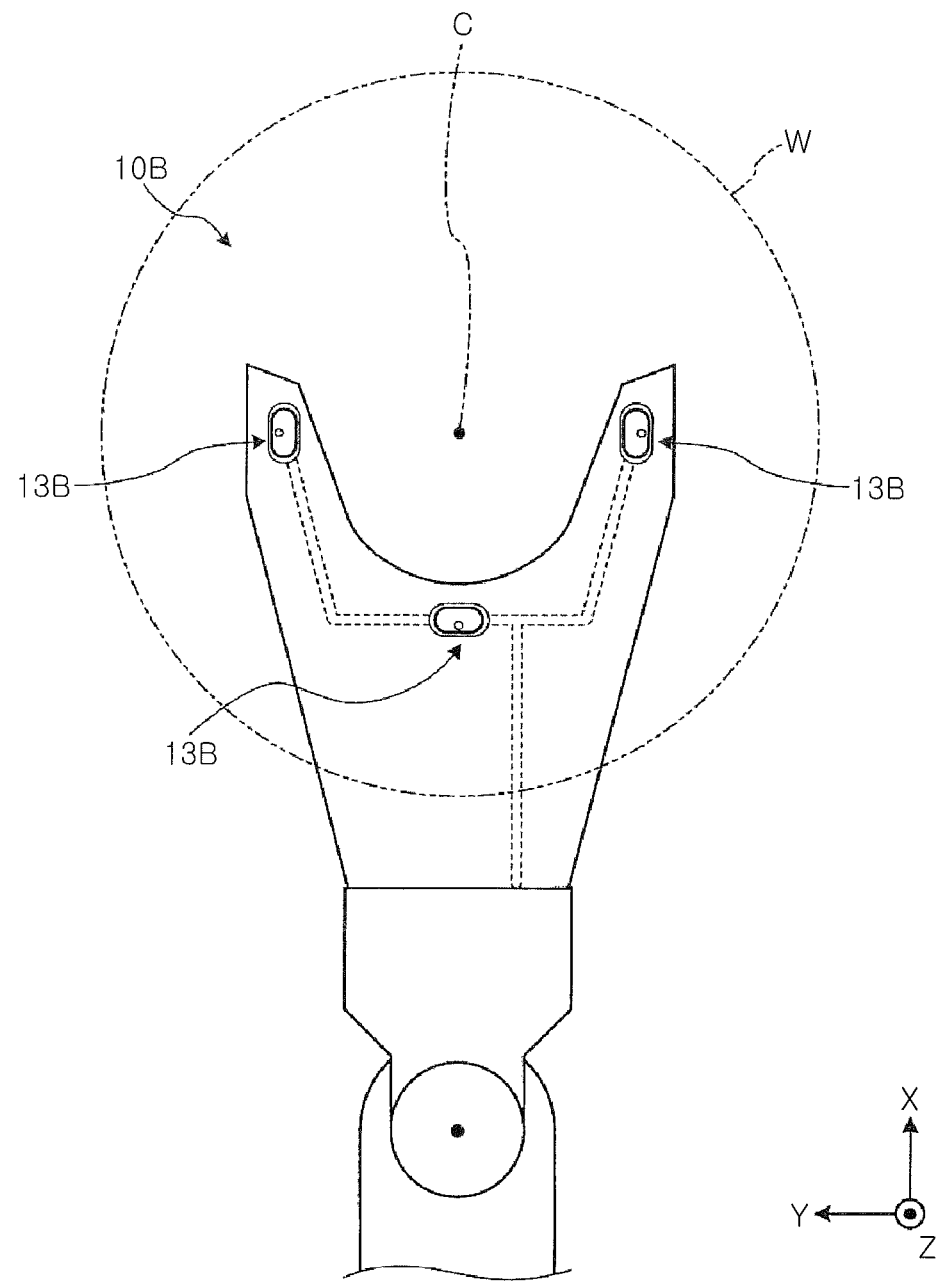
FIG. 9 is a schematic plan view of a hand according to a modified example of the second embodiment.

FIG. 9 is a schematic plan view of a hand 10B according to a modified example of the second embodiment. The foregoing description has been made by taking, as an example, a case where the support portion 12b supports the pad 13A at the position offset radially inward from the center of the major surface portion 13b. Alternatively, as shown in FIG. 9, the support portion 12b may support the pad 13B at the position offset outward from the center of the major surface portion 13b in the radial direction of an imaginary circle drawn about the center of the wafer W, i.e., at the position farther from the center of the wafer W than the center of the major surface portion 13b.

In this case, the bending amount of the inner section 13bb becomes large. Thus, the outer section 13ba is bent by the large bending of the inner section 13bb. Moreover, there is generated a difference between the atmospheric pressure and the pressure of the inner space K. This enables the pad 13B to reliably conform to the wafer W.

As described above, the suction structure according to the second embodiment includes the fixing base (plate), the pad, the seal wall, the support portion and the suction hole. The pad is provided with the contact portion that makes contact with the target object to be sucked and is supported with respect to the fixing base.

The seal wall of the contact portion forms the inner space K in conjunction with the major surface portion of the pad as the contact portion makes contact with the target object. The support portion is provided in the fixing base so as to support the pad in the position offset from the center of the major surface portion of the pad. The suction hole is formed to bring the inner space K into communication with the vacuum source.

Therefore, according to the suction structure of the second embodiment, it is possible to reliably suck a warped wafer.

In the respective embodiments described above, there has been taken an example where the major surface portion of the pad has an oblong shape with round corners. The major surface portion may have a substantially oval shape including an oblong shape with round corners and an elliptical shape. However, the shape of the major surface portion is not limited to the substantially oval shape but may be a substantially circular shape or other shapes.

In the respective embodiments described above, there has been described a single-arm robot by way of example. However, the present disclosure may be applied to a dual-arm robot or multi-arm robots.

In the respective embodiments described above, there has been described an example where the target object is a wafer. However, the target object is not limited thereto but may be any thin substrate. In this regard, the kind of the substrate does not matter. The substrate may be, e.g., a glass substrate for a liquid crystal panel display.

In case of the glass substrate, the aforementioned radial direction refers to a radial direction of an imaginary circle drawn about the center of the target object or a direction radially extending from the center of the target object to be sucked.

The target object may not be a substrate as long as it is a thin workpiece.

In the respective embodiments described above, description has been made by taking, as an example, a case where the robot is a substrate transfer robot for transferring a substrate such as a wafer or the like. However, the robot may be a robot for performing a work other than a transfer work. For example, the robot may be an assembling robot that performs a specified assembling work while vacuum-sucking a thin workpiece through the use of a hand provided with a suction structure.

The number of robot arms, the number of robot hands and the number of axes are not limited by the respective embodiments described above.

It should be understood by those skilled in the art that various modifications, combinations, sub-combinations and alterations may occur depending on design requirements and other factors insofar as they are within the scope of the appended claims or the equivalents thereof.

What is claimed is:

1. A suction structure comprising:
 a pad including a contact portion which makes contact with a target object to be sucked and which has a seal wall, and a major surface portion which is surrounded by the contact portion and which defines an inner space in conjunction with the seal wall as the contact portion makes contact with the target object; and
 a fixing base including a support portion configured to support the pad at a position offset from the center of the major surface portion of the pad, and a suction hole configured to bring the inner space into communication with a vacuum source.

2. The suction structure of claim 1, wherein the support portion is configured to support the pad at the position closer to the center of the target object in a normal position than the center of the major surface portion.

3. The suction structure of claim 2, wherein a thin portion is provided in the major surface portion of the pad.

4. The suction structure of claim 3, wherein the thin portion includes at least one groove which is formed to extend along a predetermined direction, the groove being formed on a surface of the major surface portion facing the target object.

5. The suction structure of claim 4, wherein the thin portion includes at least one groove formed to extend substantially along a circumferential direction of an imaginary circle drawn about the center of the target object in the normal position.

6. The suction structure of claim 4, wherein the thin portion includes at least one groove formed in a substantially orthogonal relationship with a line which passes through the center of an imaginary circle drawn about the center of the target object in the normal position and the center of the major surface portion.

7. The suction structure of claim 2, wherein the pad is formed into a substantially elliptical shape and is arranged such that a major axis of the pad is substantially orthogonal to a radial direction of an imaginary circle drawn about the center of the target object in the normal position.

8. The suction structure of claim 1, wherein the support portion is configured to support the pad at the position farther from the center of the target object in a normal position than the center of the major surface portion.

9. The suction structure of claim 8, wherein a thin portion is provided in the major surface portion of the pad.

10. The suction structure of claim 9, wherein the thin portion includes at least one groove which is formed to extend along a predetermined direction, the groove being formed on a surface of the major surface portion facing the target object.

11. The suction structure of claim 10, wherein the thin portion includes at least one groove formed to extend substantially along a circumferential direction of an imaginary circle drawn about the center of the target object in the normal position.

12. The suction structure of claim 10, wherein the thin portion includes at least one groove formed in a substantially orthogonal relationship with a line which passes through the center of an imaginary circle drawn about the center of the target object in the normal position and the center of the major surface portion.

13. The suction structure of claim 8, wherein the pad is formed into a substantially elliptical shape and is arranged such that a major axis of the pad is substantially orthogonal to a radial direction of an imaginary circle drawn about the center of the target object in the normal position.

14. The suction structure of claim 1, wherein a thin portion is provided in the major surface portion of the pad.

15. The suction structure of claim 14, wherein the thin portion includes at least one groove which is formed to extend along a predetermined direction, the groove being formed on a surface of the major surface portion facing the target object.

16. The suction structure of claim 15, wherein the thin portion includes at least one groove formed to extend substantially along a circumferential direction of an imaginary circle drawn about the center of the target object in the normal position.

17. The suction structure of claim 16, wherein the thin portion further includes at least one additional groove formed to extend along a radial direction of the imaginary circle.

18. The suction structure of claim 15, wherein the thin portion includes at least one groove formed in a substantially orthogonal relationship with a line which passes through the center of an imaginary circle drawn about the center of the target object in the normal position and the center of the major surface portion.

19. The suction structure of claim 18, wherein the thin portion further includes at least one additional groove formed to extend along a radial direction of the imaginary circle.

20. The suction structure of claim 1, wherein the pad is formed into a substantially elliptical shape and is arranged such that a major axis of the pad is substantially orthogonal to a radial direction of an imaginary circle drawn about the center of the target object in a normal position.

21. The suction structure of claim 1, wherein the inner space becomes a vacuum chamber by an operation of the vacuum source when the target object makes contact with the contact portion.

22. A robot hand comprising the suction structure of claim 1.

23. A robot comprising the robot hand of claim 22.

* * * * *